(12) United States Patent
Hayashi

(10) Patent No.: US 6,946,802 B2
(45) Date of Patent: Sep. 20, 2005

(54) ELECTRONIC MODULE, METHODS OF MANUFACTURING AND DRIVING THE SAME, AND ELECTRONIC INSTRUMENT

(75) Inventor: Takaaki Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 69 days.

(21) Appl. No.: 10/649,902

(22) Filed: Aug. 28, 2003

(65) Prior Publication Data

US 2004/0084740 A1 May 6, 2004

(30) Foreign Application Priority Data

| Aug. 30, 2002 | (JP) | ................................. 2002-253544 |
| Sep. 9, 2002 | (JP) | ................................. 2002-262923 |
| Sep. 12, 2002 | (JP) | ................................. 2002-266832 |
| Jul. 16, 2003 | (JP) | ................................. 2003-275430 |

(51) Int. Cl.$^7$ .......................... G09G 3/10; H05B 39/00; H01L 23/495
(52) U.S. Cl. ................... 315/169.3; 315/160; 315/156; 315/159; 257/666; 257/668
(58) Field of Search ............................ 315/169.3, 156, 315/159, 160, 167; 257/666, 668, 672, 690–692; 345/204–206, 58; G09G 3/10; H05B 39/00; H01L 23/495

(56) References Cited

U.S. PATENT DOCUMENTS 5,995,088 A  * 11/1999 Stoller ........................ 345/205
6,184,585 B1 *  2/2001 Martinez et al. ............ 257/777
6,424,092 B1 *  7/2002 Odake et al. ............. 315/169.3
6,518,962 B2     2/2003 Kimura et al. ............... 345/211
6,809,390 B2 * 10/2004 Toda et al. .................. 257/434
6,809,411 B2 * 10/2004 Hierholzer .................. 257/678
6,822,164 B2 * 11/2004 Tsuji et al. ................. 174/52.1
6,861,279 B2 *  3/2005 Nakanishi et al. ............ 438/69
2002/0113246 A1 *  8/2002 Nagai et al. .................. 257/99
2002/0173178 A1 * 11/2002 Matsunaga ................... 439/67
2003/0209786 A1 * 11/2003 Corisis et al. .............. 257/666

FOREIGN PATENT DOCUMENTS

WO        WO 98/40871        9/1998        ............ G09G/3/30

OTHER PUBLICATIONS

U.S. Appl. No. 10/314,303, filed Dec. 9, 2002, Kimura et al.

* cited by examiner

Primary Examiner—Trinh Vo Dinh
(74) Attorney, Agent, or Firm—Oliff & Berridge, PLC

(57) ABSTRACT

An electronic module includes an EL section; a first substrate on which the EL section is formed; a second substrate attached to the first substrate; an integrated circuit chip mounted on the second substrate; a plurality of first power supply interconnects formed on the first substrate, extending through a pair of regions located on both sides of the EL section; and a plurality of second power supply interconnects formed on the second substrate, extending through a pair of regions located on both sides of the integrated circuit chip.

13 Claims, 18 Drawing Sheets

ELECTRONIC MODULE, METHODS OF MANUFACTURING AND DRIVING THE SAME, AND ELECTRONIC INSTRUMENT

Japanese Patent Application No. 2002-253544 filed on Aug. 30, 2002, Japanese Patent Application No. 2002-262923 filed on Sep. 9, 2002, Japanese Patent Application No. 2002-266832 filed on Sep. 12, 2002, and Japanese Patent Application No. 2003-275430 filed on Jul. 16, 2003, are hereby incorporated by reference in their entirety.

BACKGROUND OF THE INVENTION

The present invention relates to an electronic module, methods of manufacturing and driving the same, and an electronic instrument.

Recently, development of electronic modules using electroluminescence (hereinafter may be referred to as "EL") has progressed. An electronic module such as an EL module includes an electronic substrate (EL panel, for example) and an interconnect substrate (flexible substrate, for example). The EL panel is driven by using a semiconductor chip (driver IC, for example) mounted on the interconnect substrate in the same manner as a liquid crystal device (liquid crystal panel, for example). However, since the operation principle of the EL panel differs from that of the liquid crystal panel, an interconnect pattern formed on the interconnect substrate for driving the EL panel needs to be arranged corresponding to the structure of the EL panel. Moreover, the electronic substrate and the interconnect substrate have a number of terminals which are electrically connected with each other. Conventionally, if the terminal arrangement of the electronic substrate is changed, the terminal arrangement of the interconnect substrate must be changed. Furthermore, in the case where several power supplies are required to drive the electronic substrate, the power supplies are provided from the outside of the electronic module. Therefore, it is difficult to adequately cope with changes in electronic substrate.

BRIEF SUMMARY OF THE INVENTION

An electronic module according to an aspect of the present invention comprises:

an EL section;

a first substrate on which the EL section is formed;

a second substrate attached to the first substrate;

an integrated circuit chip mounted on the second substrate; and a plurality of power supply interconnects for allowing current to flow through the EL section, wherein the power supply interconnects include: a plurality of first power supply interconnects formed on the first substrate, extending through a pair of regions located on both sides of the EL section; and a plurality of second power supply interconnects formed on the second substrate, extending through a pair of regions located on both sides of the integrated circuit chip, the first and second power supply interconnects being electrically connected.

A method of manufacturing an electronic module according to another aspect of the present invention comprises:

fixing a first substrate, on which an EL section is formed, with a second substrate on which an integrated circuit chip is mounted, wherein the first substrate includes a plurality of first power supply interconnects which are formed extending through a pair of regions located on both sides of the EL section, wherein the second substrate includes a plurality of second power supply interconnects which are formed extending through a pair of regions located on both sides of the integrated circuit chip, and wherein the first and second power supply interconnects are electrically connected in the step of fixing the first and second substrate.

An electronic module according to a further aspect of the present invention comprises:

an electronic substrate including a plurality of first terminals;

an interconnect substrate on which an interconnect pattern is formed, the interconnect pattern including a plurality of second terminals electrically connected with the first terminals of the electronic substrate, at least two first interconnects extending from at least two of the second terminals, and at least two second interconnects formed in a state to be electrically insulated from the first interconnects; and an electrical connection section which electrically connects at least one of the first interconnects with at least one of the second interconnects.

A method of manufacturing an electronic module according to a still further aspect of the present invention comprises:

electrically connecting a plurality of first terminals of an electronic substrate with a plurality of second terminals of an interconnect substrate; and electrically connecting at least one of two or more first interconnects extending from two or more of the second terminals with at least one of two or more second interconnects formed in a state to be electrically insulated from the first interconnects, by means of an electrical connection section.

An electronic module according to an even further aspect of the present invention comprises:

an electronic substrate, and an interconnect substrate which is attached to the electronic substrate and on which an integrated circuit chip is mounted, wherein the interconnect substrate includes an input terminal, and at least one amplifier circuit which generates a plurality of different amplified power supplies by amplifying an external power supply input to the input terminal.

A method of driving the electronic module according to a yet further aspect of the present invention comprises:

inputting an external power supply to an input terminal formed on an interconnect substrate on which an integrated circuit chip is mounted;

generating a plurality of different amplified power supplies by amplifying the external power supply by using one or more amplifier circuits formed on the interconnect substrate; and driving an electronic substrate electrically connected with the interconnect substrate by using the plurality of different amplified power supplies.

DETAILED DESCRIPTION OF THE EMBODIMENT

Figure 1:
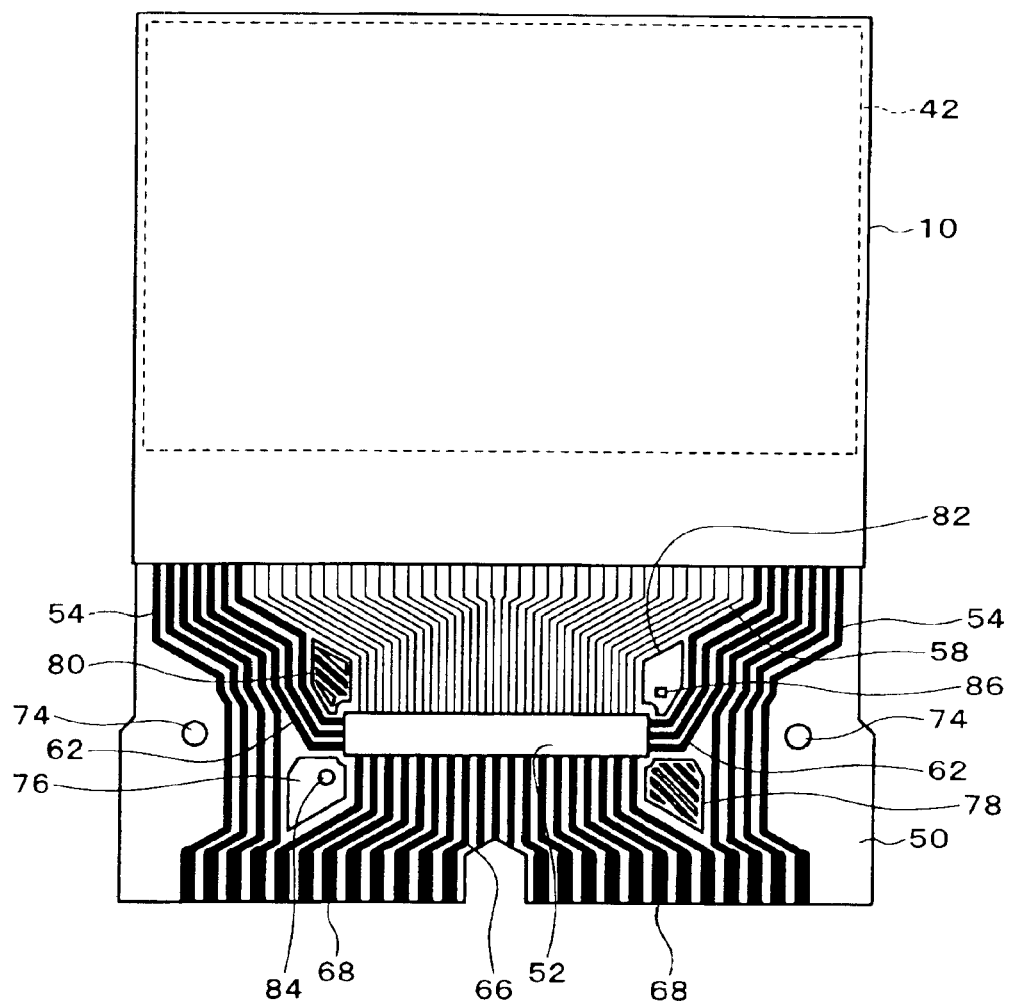
FIG. 1 illustrates an electronic module according to a first embodiment of the present invention.

Embodiments of the present invention may provide an electronic module having interconnects disposed corresponding to the EL structure, a method of manufacturing the same, and an electronic instrument, may provide an electronic module capable of dealing with a change in terminal arrangement of an electronic substrate, a method of manufacturing the same, and an electronic instrument, or may provide an electronic module which can be driven by inputting only a few types of power supplies, a method of driving the same, and an electronic instrument.

(1) An electronic module according to an embodiment of the present invention comprises:

an EL section;

a first substrate on which the EL section is formed;

a second substrate attached to the first substrate;

an integrated circuit chip mounted on the second substrate; and a plurality of power supply interconnects for allowing current to flow through the EL section, wherein the power supply interconnects include: a plurality of first power supply interconnects formed on the first substrate, extending through a pair of regions located on both sides of the EL section; and a plurality of second power supply interconnects formed on the second substrate, extending through a pair of regions located on both sides of the integrated circuit chip, the first and second power supply interconnects being electrically connected.

According to this electronic module, the power supply interconnects are formed extending through a pair of regions located on both sides of the EL section and the integrated circuit chip. Therefore, current can be allowed to equivalently flow on both sides of the EL section due to equivalence of impedance of the power supply interconnects the both sides, lowering the impedance to diminish noise.

(2) This electronic module may further comprise a plurality of signal interconnects for inputting a drive signal from the integrated circuit chip to the EL section, and the signal interconnects may be formed in a region interposing between a first region in which one part of the power supply interconnects are formed and a second region in which the other part of the power supply interconnects are formed.

(3) In this electronic module, width of each of the signal interconnects may be narrower than width of each of the power supply interconnects.

(4) This electronic module may further comprise:

a pair of scanning drivers disposed on both sides of the EL section, respectively, on the first substrate; and a plurality of control interconnects for inputting a control signal from the integrated circuit chip to each of the scanning drivers, and the control interconnects may be formed in a pair of regions which are located on both sides of a region in which the signal interconnects are formed and interpose between the first region and the second region.

(5) This electronic module may further comprise a plurality of connector terminals formed on an end portion of the second substrate except a portion to which the first substrate is attached, and width of each of the connector terminals may be formed to be wider than width of each of the power supply interconnects.

(6) An electronic instrument according to another embodiment of the present invention comprises the above electronic module.

(7) A method of manufacturing an electronic module according to a further embodiment of the present invention comprises:

fixing a first substrate, on which an EL section is formed, with a second substrate on which an integrated circuit chip is mounted, wherein the first substrate includes a plurality of first power supply interconnects which are formed extending through a pair of regions located on both sides of the EL section, wherein the second substrate includes a plurality of second power supply interconnects which are formed extending through a pair of regions located on both sides of the integrated circuit chip, and wherein the first and second power supply interconnects are electrically connected in the step of fixing the first and second substrate.

According to this method of manufacturing an electronic module, the power supply interconnects are formed extending through a pair of regions located on both sides of the EL section and the integrated circuit chip. Therefore, current can be allowed to equivalently flow on both sides of the EL section due to equivalence of impedance of the power supply interconnects on the both sides, lowering the impedance to diminish noise.

(8) An electronic module according to a still further embodiment of the present invention comprises:

an electronic substrate including a plurality of first terminals;

an interconnect substrate on which an interconnect pattern is formed, the interconnect pattern including a plurality of second terminals electrically connected with the first terminals of the electronic substrate, at least two first interconnects extending from at least two of the second terminals, and at least two second interconnects formed in a state to be electrically insulated from the first interconnects; and an electrical connection section which electrically connects at least one of the first interconnects with at least one of the second interconnects.

According to this electronic module, it is possible to change the transmission paths of the interconnect pattern depending on which of the first interconnects and the second interconnects are electrically connected by the electrical connection section. Therefore, even if the arrangement sequence of the first terminals of the electronic substrate is changed, it is possible to deal with the change by merely changing the transmission paths by using the electrical connection section.

(9) This electronic module may further comprise an integrated circuit chip mounted on the interconnect substrate, and the second interconnects may be electrically connected with the integrated circuit chip.

(10) In this electronic module, the electrical connection section may be provided at a position closer to the electronic substrate than the integrated circuit chip.

(11) In this electronic module, the electrical connection section may be provided in each of a pair of regions respectively located closer to both ends of the interconnect substrate than a center of the interconnect substrate in a widthwise direction.

(12) An electronic instrument according to a still further embodiment of the present invention comprises the electronic module as described in (8) to (11).

(13) A method of manufacturing an electronic module according to a still further embodiment of the present invention comprises:

electrically connecting a plurality of first terminals of an electronic substrate with a plurality of second terminals of an interconnect substrate; and electrically connecting at least one of two or more first interconnects extending from two or more of the second terminals with at least one of two or more second interconnects formed in a state to be electrically insulated from the first interconnects, by means of an electrical connection section.

According to this method of manufacturing an electronic module, it is possible to change the transmission paths of the interconnect pattern depending on which of the first interconnects and the second interconnects are electrically connected by the electrical connection section. Therefore, even if the arrangement sequence of the first terminals in the electronic substrate is changed, it is possible to deal with the change by merely changing the transmission paths by using the electrical connection section.

(14) An electronic module according to a still further embodiment of the present invention comprises:

an electronic substrate; and an interconnect substrate which is attached to the electronic substrate and on which an integrated circuit chip is mounted, wherein the interconnect substrate includes an input terminal and one or more amplifier circuits, each of the amplifier circuits generating a plurality of different amplified power supplies by amplifying an external power supply input to the input terminal.

According to this electronic module, since the plurality of different amplified power supplies are generated by amplifying the external power supply, the electronic module can be driven by a few types of external power supplies (single power supply, for example).

(15) In this electronic module, the integrated circuit chip may be driven by the external power supply, and the electronic substrate may be driven by the amplified power supplies.

(16) In this electronic module, the amplifier circuit may be formed in a region between the integrated circuit chip and the input terminal.

(17) In this electronic module, the integrated circuit chip may be mounted at a center of the interconnect substrate in a widthwise direction, and a pair of the amplifier circuits may be respectively formed on both end portions of the interconnect substrate in the widthwise direction.

(18) In this electronic module, the interconnect substrate may include:

signal interconnects which extend from the integrated circuit chip toward the electronic substrate; and power supply interconnects which extend from the pair of amplifier circuits toward the electronic substrate, and the power supply interconnects may be formed to be wider than the signal interconnects.

(19) In this electronic module, one of the amplifier circuits may include a first circuit and a second circuit, the first circuit being formed on the integrated circuit chip, and a second circuit being provided separately from the integrated circuit chip.

(20) In this electronic module, the second circuit may include a capacitor.

(21) In this electronic module, the second circuit may include an inductor.

(22) An electronic instrument according to an even further embodiment of the present invention comprises the electronic module as described in (14) to (21).

(23) A method of driving an electronic module according to a yet further embodiment of the present invention comprises:

inputting an external power supply to an input terminal formed on an interconnect substrate on which an integrated circuit chip is mounted;

generating a plurality of different amplified power supplies by amplifying the external power supply by using one or more amplifier circuits formed on the interconnect substrate; and driving an electronic substrate electrically connected with the interconnect substrate by using the plurality of different amplified power supplies.

According to this method of driving an electronic module, since the plurality of different amplified power supplies are generated by amplifying the external power supply, the electronic module can be driven by a few types of external power supplies (single power supply, for example).

In the following sections, embodiments of the present invention are described in more detail referring to accompanying drawings.

First Embodiment

Figure 2:
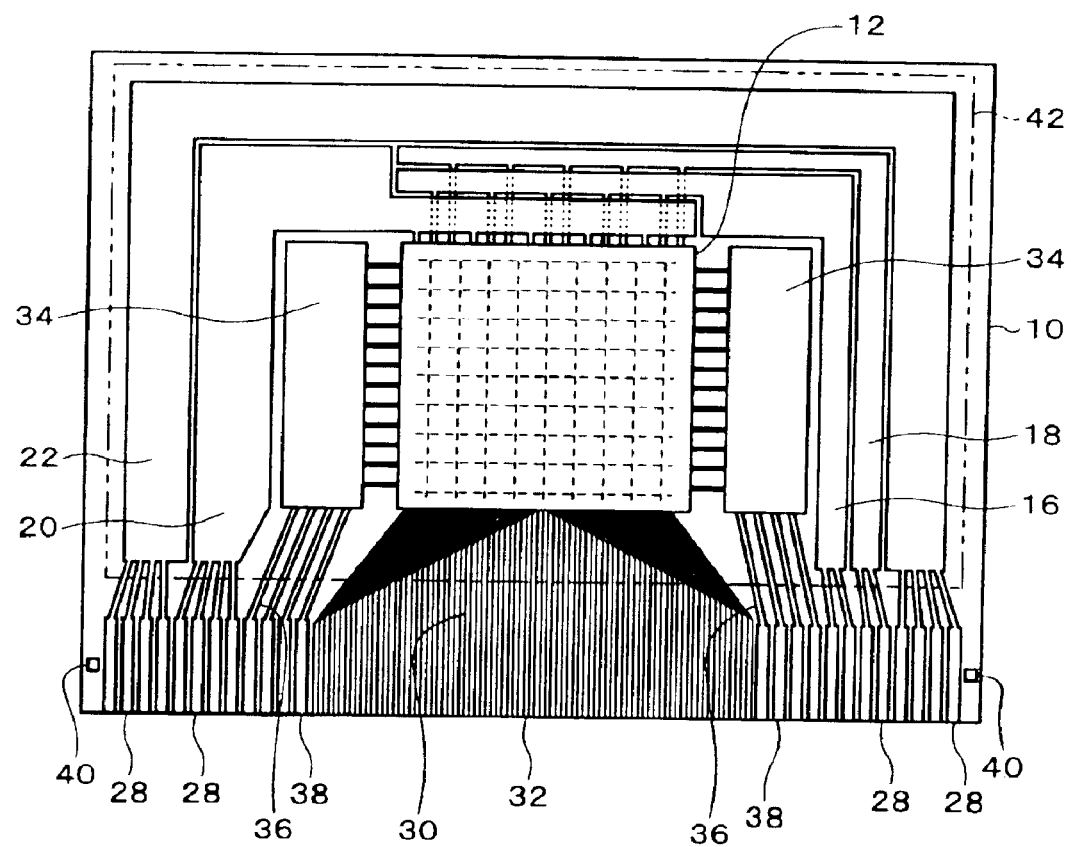
FIG. 2 is a plan view illustrating a first substrate of the electronic module according to the first embodiment of the present invention.

FIG. 1 illustrates an electronic module according to a first embodiment of the present invention. The electronic module has a first substrate 10. FIG. 2 is a plan view of the first substrate 10, and FIG. 3 is a cross-sectional view of the first substrate 10.

The first substrate 10 may be a glass substrate, a plastic substrate, or a silicon substrate. As shown in FIG. 3, in the case where light is extracted from the first substrate 10, a light-transmitting substrate is used as the first substrate 10. The first substrate 10 has an EL section 12 such as an organic EL section. The EL section 12 emits light by utilizing an electroluminescence phenomenon. The EL section 12 may be a carrier injection type. The EL section 12 is driven by electric current. In more detail, current flows through a luminescent material (organic material, for example) 14 (see FIG. 3). The first substrate 10 having the EL section 12 may be an EL panel.

As shown in FIG. 2, a plurality of first power supply interconnects 16, 18, 20, and 22 are formed on the first substrate 10. The first power supply interconnects 16, 18, 20, and 22 are formed extending through a pair of regions located on both sides of the EL section 12. Each of the first power supply interconnects 16, 18, and 20 is an anode interconnect for allowing current to flow through the EL section 12. Each of the first power supply interconnects 16, 18, and 20 is formed to have a different width, and is suitable for allowing a different value of current to flow corresponding to the difference in luminous efficiency depending on the color (RGB) of the luminescent material 14. The first power supply interconnect 22 is a cathode interconnect. The first power supply interconnect 22 is disposed on the outer side of the first power supply interconnects 16, 18, and 20. The first power supply interconnect 22 is formed in the shape of the letter "C" in order to avoid the edge on which the second substrate 50 is attached.

Figure 3:
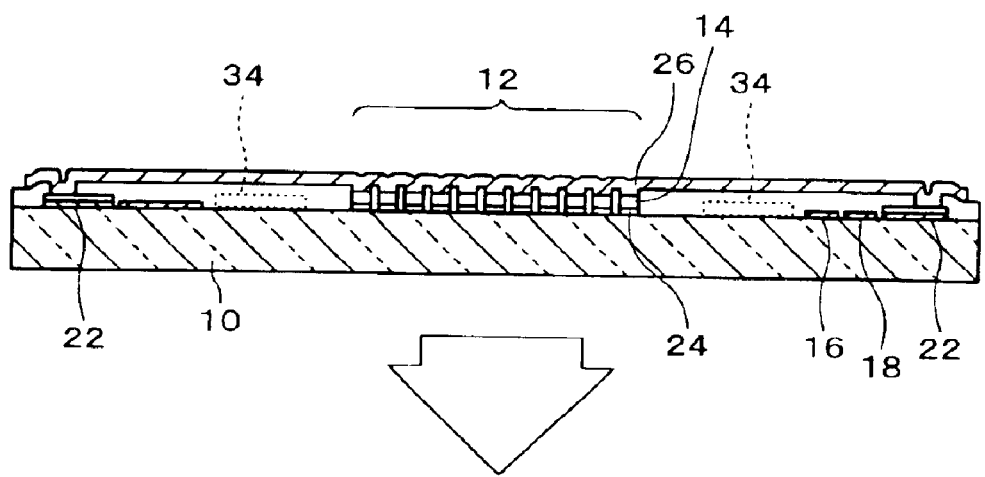
FIG. 3 is a cross-sectional view illustrating a first substrate of an electronic module according to the first embodiment of the present invention.

The first power supply interconnects (anode interconnects) 16, 18, and 20 are connected with a plurality of anodes 24 (see FIG. 3). The first power supply interconnect (cathode interconnect) 22 is connected with a cathode 26 (see FIG. 3). The cathode 26 is formed to face the anodes 24. The luminescent material 14 is provided between each of the anodes 24 and the cathode 26. A hole transport layer may be formed between the anodes 24 and the luminescent material 14, and an electron transport layer may be formed between the cathode 26 and the luminescent material 14. Each of the first power supply interconnects 16, 18, 20, and 22 is divided into a plurality of interconnects, each having a terminal 28.

The first substrate 10 has a plurality of first signal interconnects 30 for inputting a drive signal to the EL section 12. The first signal interconnects 30 are formed in a region interposing between first and second regions in which one part of and the other part of the first power supply interconnects 16, 18, 20, and 22 are formed. Each of the first signal interconnects 30 is formed to be narrower than the first power supply interconnects 16, 18, 20, and 22. Terminals 32 of the first signal interconnects 30 are formed to be narrower than the terminals 28 of the first power supply interconnects.

A pair of scanning drivers 34 is formed on both sides of the EL section 12, respectively, on the first substrate 10. The scanning driver 34 may be a chip component or a thin film circuit (circuit including TFTs) formed on the first substrate 10. Each of the scanning drivers 34 is disposed between the EL section 12 and each of the first and second regions in which one part of and the other part of the first power supply interconnects 16, 18, 20, and 22 are formed. Each of the pair of scanning drivers 34 is connected with a plurality of first control interconnects 36 for inputting a control signal. The first control interconnects 36 are formed in a pair of regions which are located on both sides of a region in which the first signal interconnects 30 are formed and interpose between the first and second regions in which one part of and the other part of the first power supply interconnects 16, 18, 20, and 22 are formed. Terminals 38 of the first control interconnects 36 may be formed to have the same width as the terminals 28 of the first power supply interconnects, and formed to be wider than the terminals 32 of the first signal interconnects 30.

In the present embodiment, the terminals 28, 32, and 38 are arranged to extend toward one side of the first substrate 10. The first substrate 10 has a first positioning mark 40. The first and second substrates 10 and 50 can be positioned by aligning the first positioning mark 40 with a second positioning mark 70 described later (see FIG. 4). A sealing section 42 is optionally provided to the first substrate 10. The sealing section 42 is provided to cover the cathode 26 to prevent entrance of moisture or oxygen. The sealing section 42 may be formed of a glass substrate or a plastic substrate if light transmittance is required. The sealing section 42 may be formed of a metal or silicon if light transmittance is not required.

Figure 4:
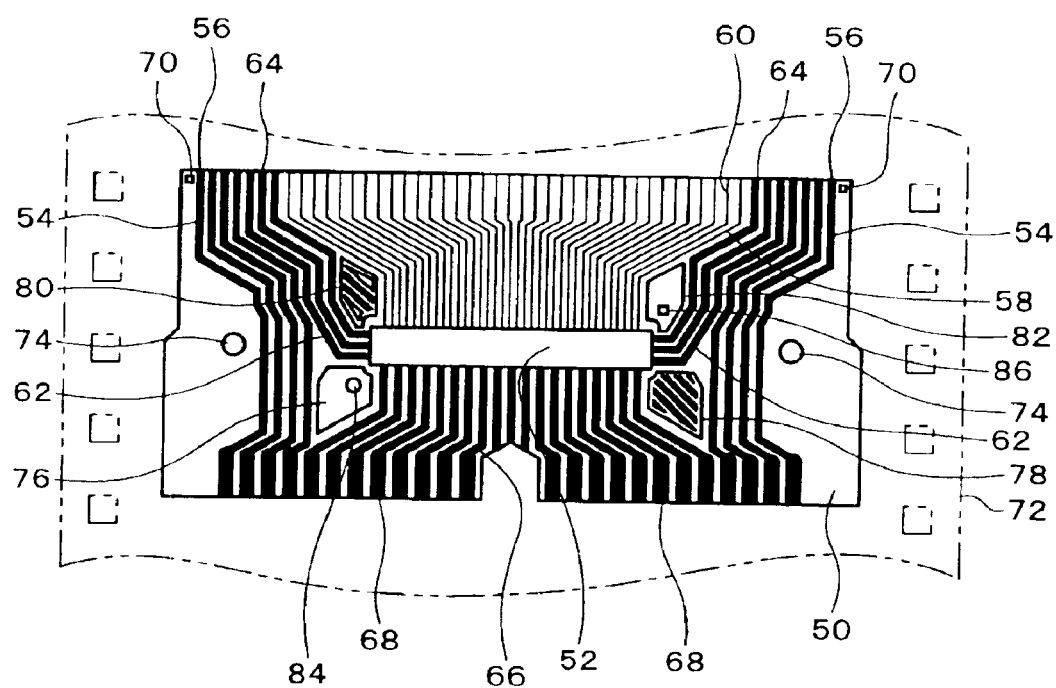
FIG. 4 is a plan view showing a second substrate of the electronic module according to the first embodiment of the present invention.

As shown in FIG. 1, an electronic module has a second substrate 50. The second substrate 50 may be a flexible substrate. The second substrate 50 is attached to the first substrate 10. FIG. 4 is a view illustrating the second substrate and a method of manufacturing the same. An integrated circuit chip 52 is mounted on the second substrate 50. A signal driver having a function of generating a signal to be supplied to the EL section 12 may be formed in the integrated circuit chip 52. The integrated circuit chip 52 may be bonded face down or electrically connected by Tape automated bonding (TAB).

A plurality of second power supply interconnects 54 are formed on the second substrate 50. The second power supply interconnects 54 are formed extending through a pair of regions located on both sides of the integrated circuit chip 52. If the second power supply interconnects 54 are formed extending through only one side of the pair of regions located on both sides of the integrated circuit chip 52, one group of the second power supply interconnects 54 becomes longer than the other group of the second power supply interconnects 54. In the present embodiment, since the difference in length between the second power supply interconnects 54 is small, current can be allowed to flow uniformly. The second power supply interconnects 54 are electrically connected with the first power supply interconnects 16, 18, 20, and 22. In more detail, terminals 56 of the second power supply interconnects 54 are electrically connected with the terminals 28 of the first power supply interconnects. The electrical connection may be established by using an anisotropic conductive material (anisotropic conductive film or anisotropic conductive paste, for example). The electrically connected first and second power supply interconnects make up a power supply interconnect for allowing current to flow through the EL section 12.

The second substrate 50 has a plurality of second signal interconnects 58 for inputting a drive signal from the integrated circuit chip 52 to the EL section 12. The second signal interconnects 58 are formed in a region interposing between first and second regions in which the second power supply interconnects 54 are formed. The second signal interconnects 58 are formed to be narrower than the second power supply interconnects 54. Terminals 60 of the second signal interconnects 58 are formed to be narrower than the terminals 56 of the second power supply interconnects 54. The second signal interconnects 58 are electrically connected with the first signal interconnects 30. In more detail, the terminals 60 of the second signal interconnects 58 are electrically connected with the terminals 32 of the first signal interconnects 30. The electrical connection may be the same as that of the terminals 28 and 56. The electrically connected first and second signal interconnects make up a signal interconnect. The signal interconnect is used to input a drive signal from the integrated circuit chip 52 to the EL section 12.

A plurality of second control interconnects 62 are formed on the second substrate 50. The second control interconnects 62 are connected with the integrated circuit chip 52 which outputs a control signal (clock signal, for example). The second control interconnects 62 are formed in a pair of regions which are located on both sides of a region in which the second signal interconnects 58 are formed and interpose between the first and second regions in which the second power supply interconnects 54 are formed. A synchronized clock signal may be output to each pair of regions which are located on both sides of the region in which the second signal interconnects 58 are formed. Terminals 64 of the second control interconnects 62 may be formed to have the same width as the terminals 56 of the second power supply interconnects 54, and to be wider than the terminals 60 of the second signal interconnects 58. The second control interconnects 62 are electrically connected with the first control interconnects 36. In more detail, the terminals 64 of the second control interconnects 62 are electrically connected with the terminals 38 of the first control interconnects 36. The electrical connection may be the same as that of the terminals 28 and 56. The electrically connected first and second control interconnects make up a control interconnect. The control interconnect is used to input a control signal (clock signal, for example) from the integrated circuit chip 52 to the scanning driver 34.

A plurality of input interconnects 66 are formed on the second substrate 50. The input interconnects 66 are connected with the integrated circuit chip 52, and extend from the integrated circuit chip 52 in the opposite direction to where the second signal interconnects 58 extend. The input interconnects 66 are used to input a data signal (digital signal, for example), a chip select signal, or source power to the integrated circuit chip 52.

Connector terminals 68 are formed on the second substrate 50. The connector terminals 68 are formed at an end portion except a portion to which the first substrate 10 is attached. The connector terminals 68 are formed to be wider than the power supply interconnects (first power supply interconnects 16, 18, 20, and 22 and second power supply interconnects 54). The connector terminals 68 are end sections of the second power supply interconnects 54 and the input interconnects 66. The connector terminals 68 are formed extending toward one side of the second substrate 50.

The second substrate 50 has a second positioning mark 70. The first and second substrates 10 and 50 can be positioned by aligning the second positioning mark 70 with the first positioning mark 40.

The second substrate 50 may be formed by punching a tape 72 as shown by a two-dot line in FIG. 4. If holes 74 are formed in advance in the second substrate 50 and the tape 72 is punched based on the holes 74, an accurate punching operation can be performed. The holes 74 can be used to fix the second substrate 50. The second substrate 50 thus fixed may be attached to the first substrate 10.

One or more dummy patterns 76, 78, 80, and 82 are formed on the second substrate 50. Since the dummy patterns 76, 78, 80, and 82 are formed, the area of the second substrate 50 which is not covered with conductive foil is reduced, whereby warping or deformation of the second substrate 50 can be prevented. The dummy patterns 76 and 82 respectively have marks 84 and 86. The marks 84 and 86 may be through holes formed in the dummy patterns 76 and 82, or through holes formed in the dummy patterns 76 and 82 and the second substrate 50, or through holes formed in a resin layer (resist layer, for example) on the dummy patterns 76 and 82. The marks 84 and 86 enable the integrated circuit chip 52 to be positioned. The marks 84 and 86 may be used to position the closest corners of the integrated circuit chip 52. The dummy patterns 78 and 80 are formed in the shape of a stripe and have a plurality of openings formed therein. Therefore, the dummy patterns 78 and 80 have high adhesion to a resin layer (resist layer, for example) formed thereon, whereby the resin layer is rarely removed.

A method of manufacturing the electronic module according to the present embodiment includes fixing the first substrate 10 on which the EL section 12 is formed with the second substrate 50 on which the integrated circuit chip 52 is mounted. The first substrate 10 includes a plurality of first power supply interconnects 16, 18, 20, and 22 which are formed extending through a pair of regions located on both sides of the EL section 12. The second substrate 50 includes a plurality of second power supply interconnects 54 which are formed extending through a pair of regions located on both sides of the integrated circuit chip 52. The first power supply interconnects 16, 18, 20, and 22 are electrically connected with the second power supply interconnects 54 in the step of fixing the first and second substrates 10 and 50.

Figure 5:
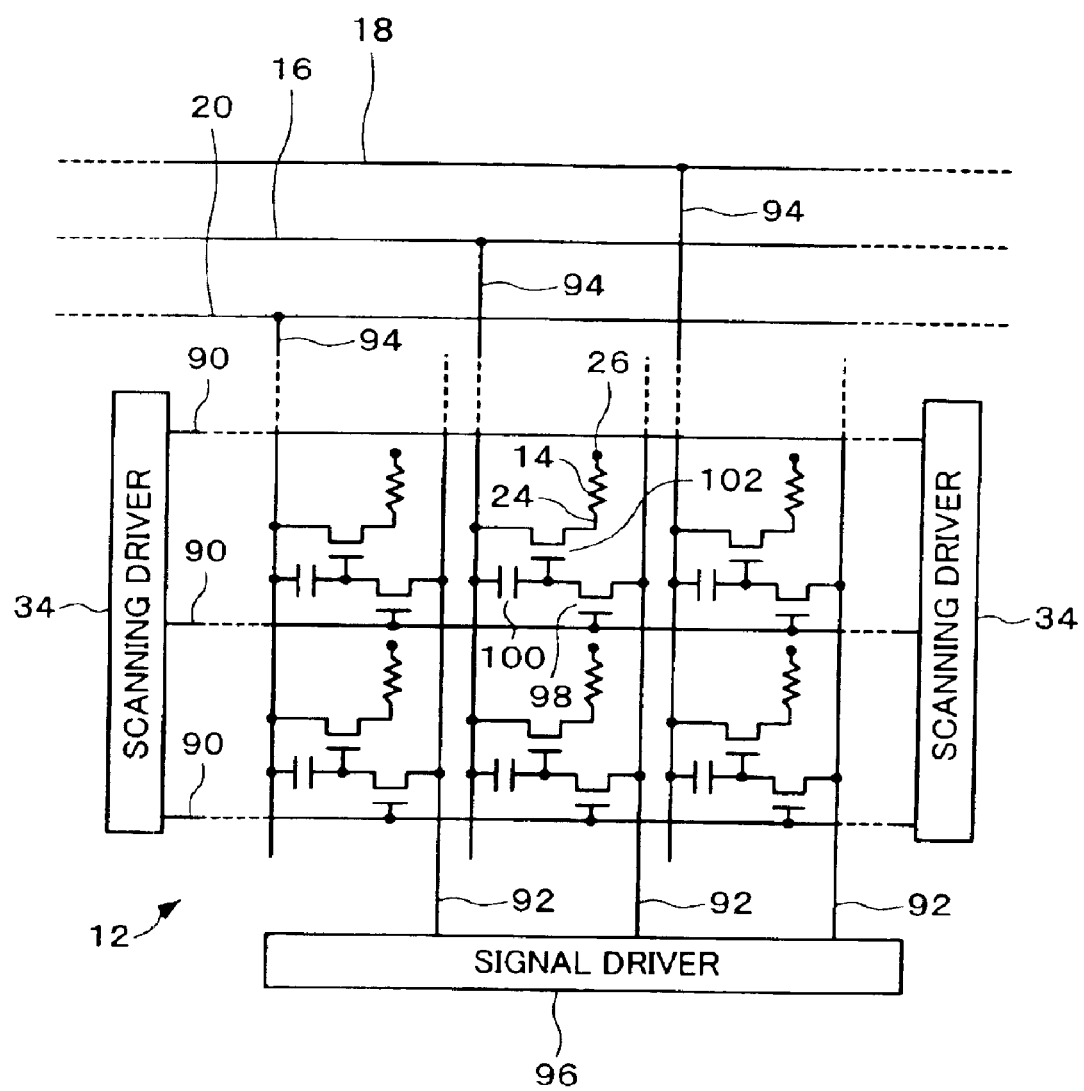
FIG. 5 is a circuit diagram of the electronic module according to the first embodiment of the present invention.

FIG. 5 is a view illustrating circuits of the electronic module according to the present embodiment. The EL section 12 has a plurality of scanning lines 90, a plurality of signal lines 92 which extend in the direction intersecting the scanning lines 90, and a plurality of power supply lines 94 which extend along the signal lines 92. The scanning lines 90 are electrically connected with a scanning driver 34 (including shift register and level shifter, for example). The signal lines 92 are electrically connected with a signal driver 96 of the integrated circuit chip 52. The power supply lines 94 are electrically connected with one of the first power supply interconnects 16, 18, or 20. The luminescent material 14 which becomes a pixel is provided corresponding to each intersecting point of the scanning lines 90 and the signal lines 92.

A switching element 98 is electrically connected with the scanning lines 90 corresponding to each pixel. In the case where the switching element 98 is a thin film transistor (MOSFET), a gate electrode of the switching element 98 is electrically connected with the scanning line 90. The signal line 92 is electrically connected with a capacitor 100 corresponding to each pixel. In more detail, the capacitor 100 is electrically connected between the signal line 92 and the power supply line 94 so that it can hold electric charges corresponding to an image signal from the signal line 92. The switching element 98 is electrically connected between the capacitor 100 and the signal line 92. The switching element 98 is controlled by a scanning signals output from the scanning line 90, and the switching element 98 controls storage of electric charges in the capacitor 100.

A drive element 102 is controlled by the amount of electric charges and the presence or absence of electric charges held by the capacitor 100. In the case where the drive element 102 is a thin film transistor (MOSFET), a gate electrode of the drive element 102 is electrically connected with an electrode of the capacitor 100 located on the side of the signal line 92. The drive element 102 is electrically connected between the power supply line 94 and the luminescent material 14. Specifically, the drive element 102 controls supply of current from the power supply line 94 to the luminescent material 14.

When the switching element 98 is turned on by the scanning signal from the scanning line 90, electric charges are stored in the capacitor 100 due to the potential difference between the signal line 92 and the power supply line 94. The control state of the drive element 102 is determined according to the electric charges. Current flows from the power supply line 94 to the anode 24 through a channel of the drive element 102, and flows to the cathode 26 through the luminescent material 14. The luminescent material 14 emits light corresponding to the amount of current that flows through the luminescent material 14.

Second Embodiment

Figure 6:
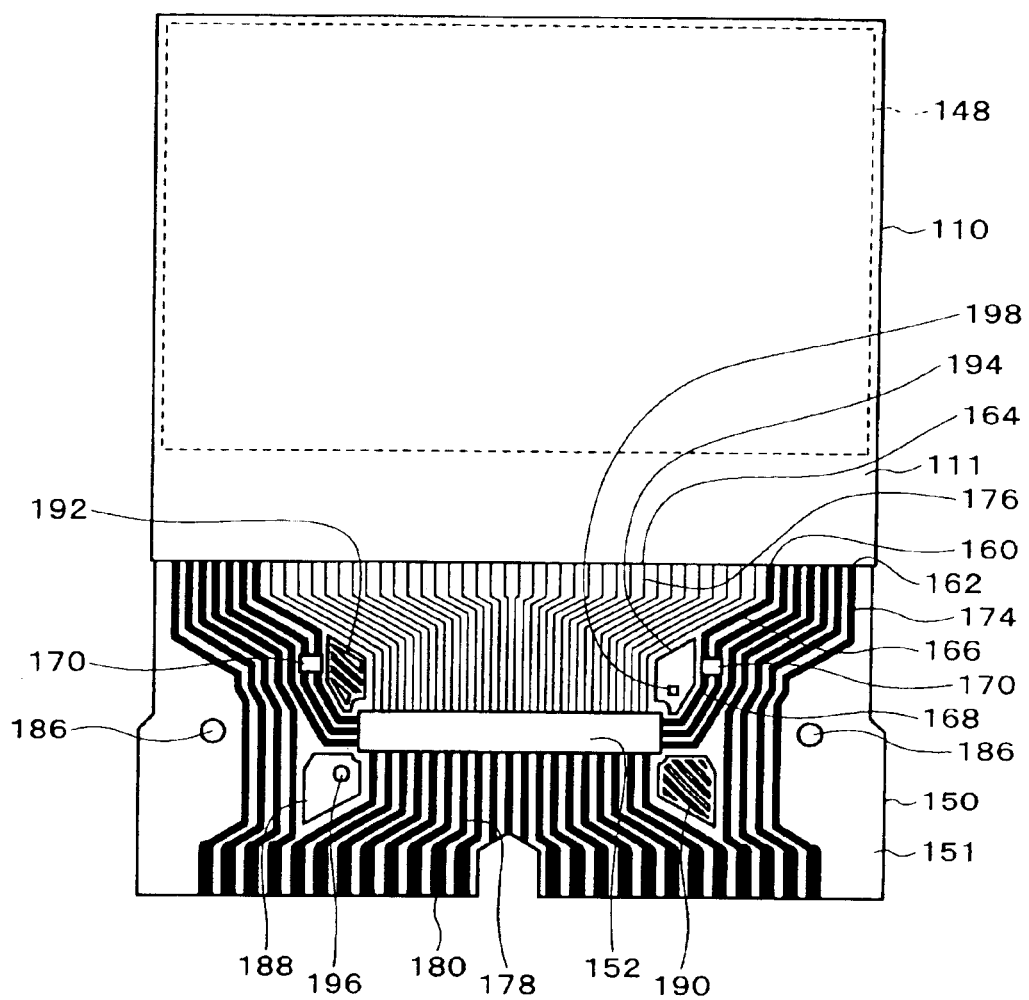
FIG. 6 illustrates an electronic module according to a second embodiment of the present invention.
Figure 7:
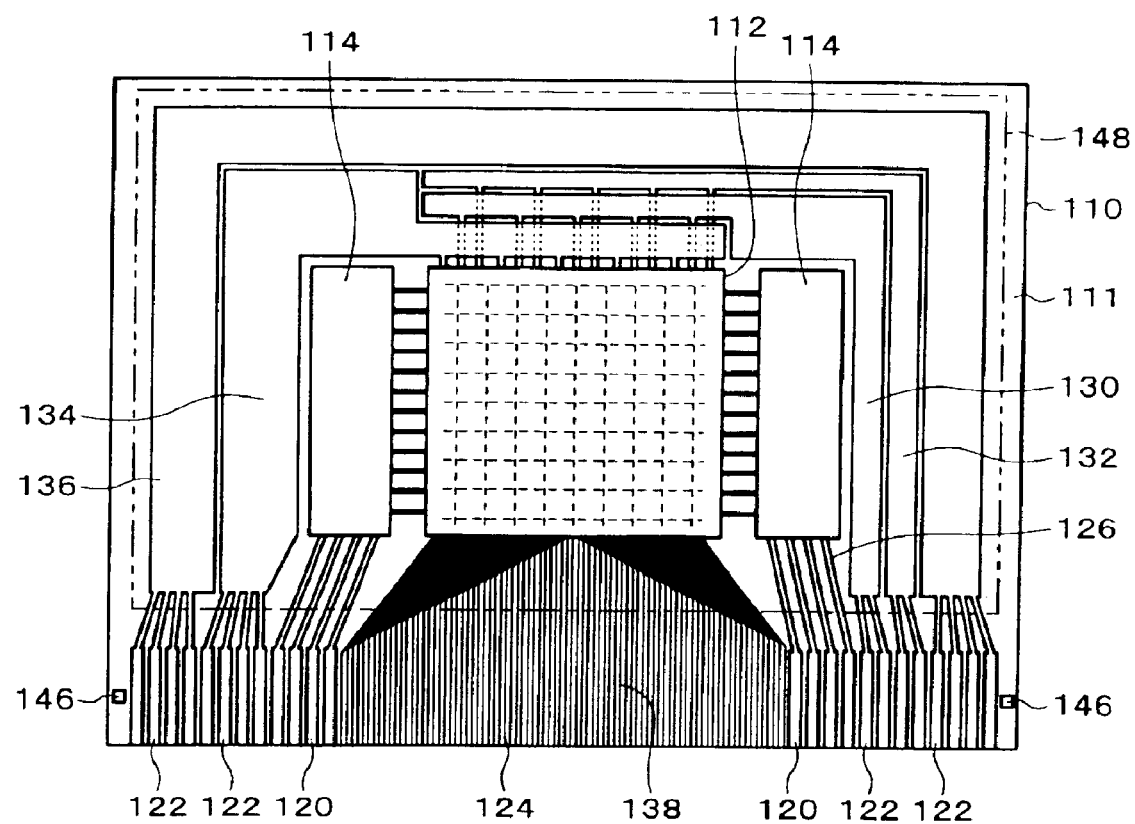
FIG. 7 is a plan view showing an electronic substrate of the electronic module according to the second embodiment of the present invention.
Figure 8:
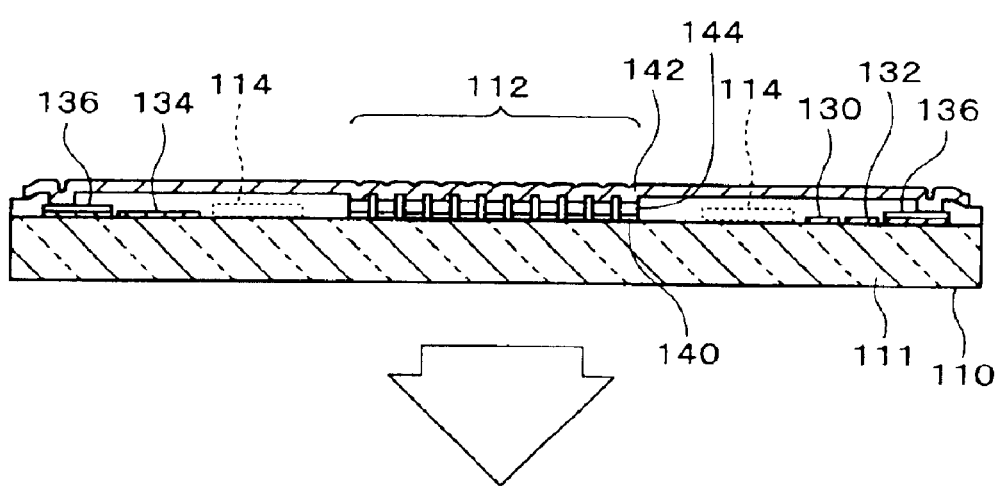
FIG. 8 is a cross-sectional view showing the electronic substrate of the electronic module according to the second embodiment of the present invention.

FIG. 6 illustrates an electronic module (EL module or liquid crystal module, for example) according to a second embodiment of the present invention. The electronic module has an electronic substrate 110. FIG. 7 is a plan view of the electronic substrate, and FIG. 8 is a cross-sectional view of the electronic substrate. The electronic substrate 110 may be a display panel (EL panel or liquid crystal panel, for example). The electronic substrate 110 has a substrate 111. The substrate 111 may be a glass substrate, a plastic substrate, or a silicon substrate. As shown in FIG. 8, in the case where light is extracted from the substrate 111, a light-transmitting substrate is used as the substrate 111.

The electronic substrate 110 has an operating section 112. The operating section 112 is a section in which operations for displaying an image are performed. In the present embodiment, the operating section 112 is an EL (organic EL) section, for example. The EL section emits light by utilizing an electroluminescence phenomenon. The EL section may be of a carrier injection type. The EL section may be driven by electric current. In more detail, current flows through a luminescent material (organic material, for example) (see FIG. 8).

A pair of scanning drivers 114 is disposed on both sides of the operating section 112, respectively, on the electronic substrate 110. The scanning driver 114 may be a chip component or a thin film circuit (circuit including TFTs) formed on the substrate 111, for example.

The electronic substrate 110 has a plurality of first terminals 120, 122, and 124. At least two of the first terminals 120 are electrically connected with a scanning driver 114 through control interconnects 126. At least two of the first terminals 122 are electrically connected with power supply interconnects 130, 132, 134, and 136. Each of the power supply interconnects 130, 132, and 134 is an anode interconnect for allowing current to flow through the operating section 112. Each of the power supply interconnects 130, 132, and 134 is formed to have a different width, and is suitable for allowing a different value of current to flow corresponding to the difference in luminous efficiency depending on the color (RGB) of the luminescent material 144 (see FIG. 8). The power supply interconnect 136 is a cathode interconnect. The power supply interconnects 130, 132, 134, 136 are formed in a pair of regions which are located on both sides of the operating section 112. The power supply interconnect (cathode interconnect) 136 is disposed on the outer side of the power supply interconnects (anode interconnects) 130, 132, and 134. The power supply interconnect 136 is formed in the shape of the letter "C" so as to avoid the edge on which an interconnect substrate 150 is attached. At least two of the first terminals 124 are electrically connected with the operating section 112 through signal interconnects 138.

Control interconnects 126 are formed in a pair of regions which are located on both sides of a region in which the signal interconnects 138 are formed and interpose between first and second regions in which one part and the other part of the power supply interconnects 130, 132, 134, and 136 are formed. The signal interconnects 138 are formed in a region interposing between a pair of regions in which the control interconnects 126 are formed. The signal interconnects 138 are formed in a region interposing between the first and second regions in which one part and the other part of the power supply interconnects 130, 132, 134, and 136 are formed. The signal interconnects 138 are formed to be narrower than the control interconnects 126. The signal interconnects 138 are formed to be narrower than the power supply interconnects 130, 132, 134, and 136.

First terminals 124 connected with the signal interconnects 138 are formed to be narrower than first terminals 122 and 120 connected with the power supply interconnects 130, 132, 134, and 136 and the control interconnects 126. The first terminals 120 connected with the control interconnects 126 may be formed to have the same width as the first terminals 122 connected with the power supply interconnects 130, 132, 134, and 136. The first terminals 120 are formed to be wider than the first terminals 124 connected with the signal interconnects 138.

The power supply interconnects (anode interconnects) 130, 132, and 134 are connected with a plurality of anodes 140 (see FIG. 8). The power supply interconnect (cathode interconnect) 136 is connected with a cathode 142 (see FIG. 8). The cathode 142 is formed to face the anodes 140. A luminescent material 144 is provided between each of the anodes 140 and the cathode 142. A hole transport layer may be formed between the anodes 140 and the luminescent material 144, and an electron transport layer may be formed between the cathode 142 and the luminescent material 144.

According to the present embodiment, the first terminals 120, 122, and 124 are arranged to extend toward one side of the electronic substrate 110. The electronic substrate 110 has a first positioning mark 146. The electronic substrate 110 and the interconnect substrate 150 can be positioned by aligning the first positioning mark 146 with a second positioning mark 182 as described later (see FIG. 10). A sealing section 148 is optionally provided to the electronic substrate 110. The sealing section 148 is formed to cover the cathode 142 to prevent entrance of moisture or oxygen. The sealing section 148 may be formed of a glass substrate or a plastic substrate if light transmittance is required. The sealing section 148 may be formed of a metal or silicon if light transmittance is not required.

An electronic module has an interconnect substrate 150. The interconnect substrate 150 has a substrate 151. An interconnect pattern is formed on the interconnect substrate 150. The substrate 151 may be a flexible substrate. The interconnect substrate 150 (substrate 151) is attached to the electronic substrate 110.

An integrated circuit chip 152 is mounted on the interconnect substrate 150. A signal driver 96 having a function of generating a signal to be output to the operating section 112 (see FIG. 12) may be formed in the integrated circuit chip 152. The integrated circuit chip 152 may be bonded face down or electrically connected by tape automated bonding (TAB).

The interconnect substrate 150 has a plurality of second terminals 160, 162, and 164. The interconnect substrate 150 has two or more first interconnects 166 extending from two or more of the second terminals 160. The interconnect substrate 150 has two or more second interconnects 168 formed so that they are electrically insulated from the first interconnects 166. The second interconnects 168 are electrically connected with the integrated circuit chip 152. A control signal (clock signal, for example) is output from the integrated circuit chip 152 to the second interconnects 168.

The interconnect substrate 150 has an electrical connection section 170. The electrical connection section 170 may be a chip component (surface-mounting component, for example). The electrical connection section 170 may be provided at a location which is closer to the electronic substrate 110 than the integrated circuit chip 152. The electrical connection section 170 may be provided to each of a pair of regions located closer to each edge of the interconnect substrate 150 than the center of the interconnect substrate 150 in the widthwise direction.

Figure 9:
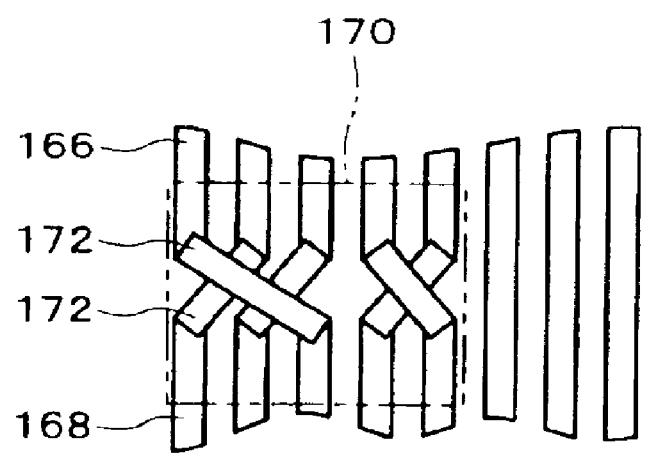
FIG. 9 illustrates an electrical connection section and its neighboring configuration of the electronic module according to the second embodiment of the present invention.

FIG. 9 illustrates the electrical connection section 170 and its neighboring configuration. One of the second interconnects 168 may be formed on an extension from one of the first interconnects 166 at an interval from the end (end opposite to the second terminal 160) of the first interconnect 166. The second interconnects 168 may be formed in the same number as the first interconnects 166.

The electrical connection section 170 electrically connects at least one of the first interconnects 166 with at least one of the second interconnects 168. The electrical connection section 170 may include one or more conductive sections 172. The conductive sections 172 may be electrically insulated from one another. One conductive section 172 may electrically connect one of the first interconnects 166 with one of the second interconnects 168. One conductive section 172 may be disposed so to cross another conductive sections 172. This allows electrical connection to be established between one of the first interconnects 166 and one of the second interconnects 168 which is not located in the extension of the former. The conductive section 172 may include a resistor. The conductive section 172 be solder. The electrically connected first and second interconnects 166 and 168 make up a control interconnect.

The interconnect substrate 150 has two or more power supply interconnects 174 extending from two or more second terminals 162. The power supply interconnects 174 are formed extending through a pair of regions located on both sides of the integrated circuit chip 152. If the power supply interconnects 174 are formed extending through only one side of the pair of regions located on both sides of the integrated circuit chip 152, one group of the power supply interconnects 174 becomes longer than the other group of the power supply interconnects 174. In the present embodiment, since the difference in length between the power supply interconnects 174 is small, current can be allowed to flow uniformly.

The interconnect substrate 150 has two or more signal interconnects 176 which extend from two or more second terminals 164. The signal interconnects 176 are formed in a region interposing between a pair of regions in which the power supply interconnects 174 are formed. The interconnect substrate 150 includes a plurality of input interconnects 178. The input interconnects 178 are connected with the integrated circuit chip 152, and extend from the integrated circuit chip 152 in the opposite direction to where the signal interconnects 176 extend. The input interconnects 178 are used to input a data signal (digital signal, for example), a chip select signal, or source power to the integrated circuit chip 152.

The interconnect substrate 150 has a plurality of connector terminals 180. The connector terminals 180 are formed at an edge excluding the portion where the electronic substrate 110 is attached. The connector terminals 180 are formed to be wider than the power supply interconnects 174. The connector terminals 180 are connected with the power supply interconnects 174 and the input interconnects 178. The connector terminals 180 are formed extending toward one side of the interconnect substrate 150.

The second terminals 160 connected with the first interconnects 166 may be formed to have the same width as the second terminals 162 connected with the power supply interconnects 174, and to be wider than that of the second terminals 164 connected with the signal interconnects 176. The first and second interconnects 166 and 168 are formed in a pair of regions which are located on both sides of a region in which the signal interconnects 176 are formed and interpose between a pair of regions in which the power supply interconnects 174 are formed. A synchronized clock signal may be output to each of the pair of regions located on both sides of the region in which the signal interconnects 176 are formed from the integrated circuit chip 152 through the second interconnects 168. The signal interconnects 176 are formed to be narrower than the power supply interconnects 174. The second terminals 164 with which the signal interconnects 176 are connected are formed to be narrower than the second terminals 162 with which the power supply interconnects 174 are connected.

The second terminals 160, 162, and 164 are respectively electrically connected with the first terminals 120, 122, and 124 of the electronic substrate 110. The electrical connection may be achieved by using an anisotropic conductive material (anisotropic conductive film or anisotropic conductive paste, for example). In more detail, the second terminals 160 connected with the first interconnects 166 are electrically connected with the first terminals 120 connected with the control interconnects 126. In other words, the first interconnects 166 are electrically connected with the control interconnects 126. The second terminals 162 connected with the power supply interconnect 174 are electrically connected with the first terminals 122 connected with the power supply interconnects 130, 132, 134, and 136. In other words, the power supply interconnect 174 is electrically connected with the power supply interconnects 130, 132, 134, and 136. The second terminals 164 connected with the signal interconnects 176 are electrically connected with the first terminals 124 connected with the signal interconnects 138. In other words, the signal interconnects 176 are-electrically connected with the signal interconnects 138.

Figure 10:
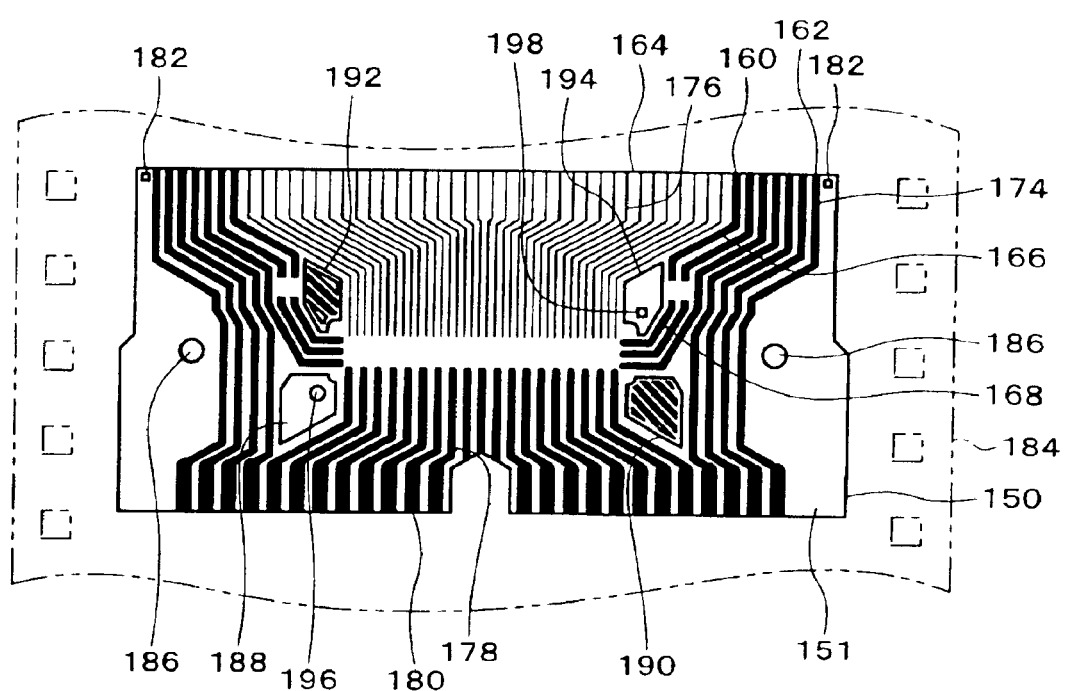
FIG. 10 illustrates a manufacturing method of an interconnect substrate of the electronic module according to the second embodiment of the present invention.

The interconnect substrate 150 has a second positioning mark 182 (see FIG. 10). The electronic substrate 110 and the interconnect substrates 150 can be positioned by aligning the second positioning mark 182 with a first positioning mark 146.

FIG. 10 is a view illustrating a method of manufacturing the interconnect substrate. FIG. 10 shows a state in which the interconnect substrate 150 is not provided with the integrated circuit chip 152 and the electrical connection section 170. The interconnect substrate 150 may be formed by punching a tape 184 as shown by a two-dot line in FIG. 10. If holes 186 are formed in advance in the interconnect substrate 150 and the tape 184 is punched based on the holes 186, an accurate punching operation can be performed. The holes 186 can be used to fix the interconnect substrate 150. The interconnect substrate 150 thus fixed may be attached to the electronic substrate 110.

One or more dummy patterns 188, 190, 192, and 194 are formed on the interconnect substrate. Since the dummy patterns 188, 190, 192, and 194 are formed, the area of the substrate 150 which is not covered with conductive foil is reduced, whereby warping or deformation of the interconnect substrate 150 can be prevented. Each of the dummy patterns 188 and 194 respectively has marks 196 and 198. The marks 196 and 198 may be through holes formed in the dummy patterns 188 and 194, or through holes formed in the dummy patterns 188 and 194 and the interconnect substrate 150, or through holes formed in a resin layer (resist layer, for example) on the dummy patterns 188 and 194. The marks 196 and 198 enable positioning of the integrated circuit chip 152. The marks 196 and 198 may be used to position the closest corner of the integrated circuit chip 152. The dummy patterns 190 and 192 are formed in the shape of a stripe, and a plurality of openings are formed in the dummy patterns 190 and 192. Therefore, the dummy patterns 190 and 192 have high adhesion to a resin layer (resist layer, for example) formed thereon, whereby the resin layer is rarely removed.

In the method of manufacturing the electronic module according to the present embodiment, the first terminals 120, 122, and 124 of the electronic substrate 110 are electrically connected with the second terminals 160, 162, and 164 of the interconnect substrate 150. At least one of the two or more first interconnects 166 extending from the two or more second terminals 160 is electrically connected with at least one of the two or more second interconnects 168 electrically insulated from the first interconnects 166 by means of the electrical connection section 170.

According to the present embodiment, it is possible to change the transmission paths of the interconnect pattern depending on which of the first interconnects 166 and second interconnects 168 are electrically connected by the electrical connection section 170. Therefore, even if the arrangement sequence of the first terminals 120 in the electronic substrate 110 is changed, it is possible to deal with the change by merely changing the transmission paths by using the electrical connection section 170.

Figure 11A:
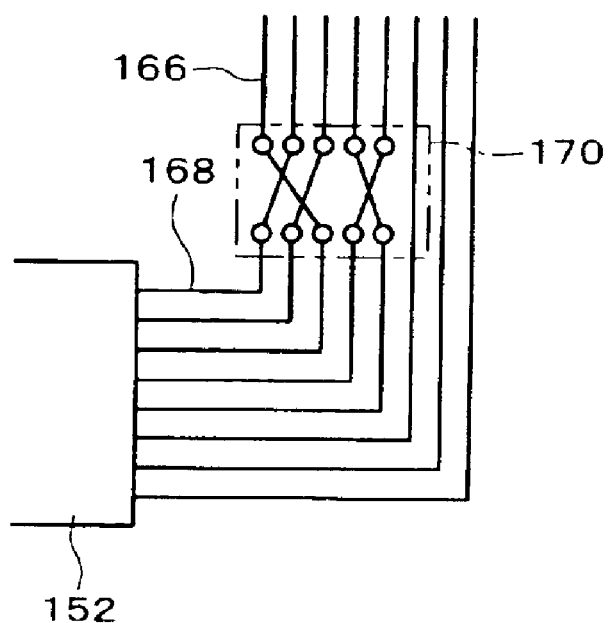
FIG. 11A and FIG. 11B illustrate connecting configurations of first and second interconnects in the electronic module according to the second embodiment of the present invention.
Figure 11B:
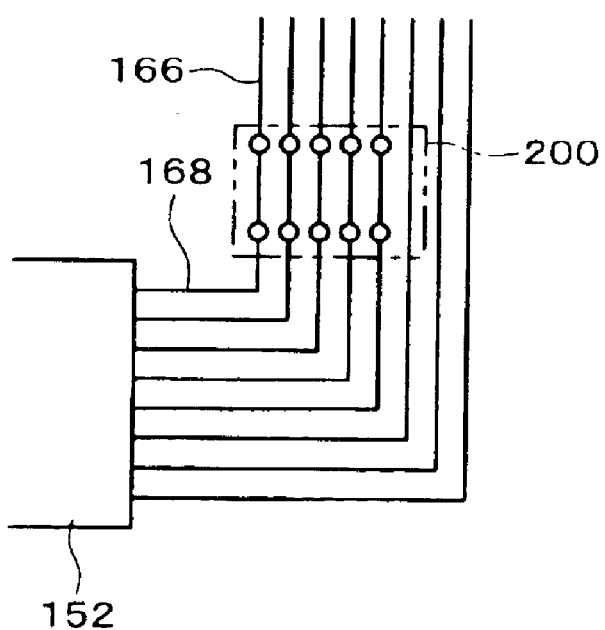

For example, instead of forming the transmission paths as shown in FIG. 11(A) by using the electrical connection section 170, another transmission path may be formed by using an electrical connection section 200 as shown in FIG. 11(B). Specifically, in FIG. 11(B), electrical connection between the first interconnects 166 and the second interconnects 168, which are located in the extension of the former, is established by the electrical connection section 200.

Figure 12:
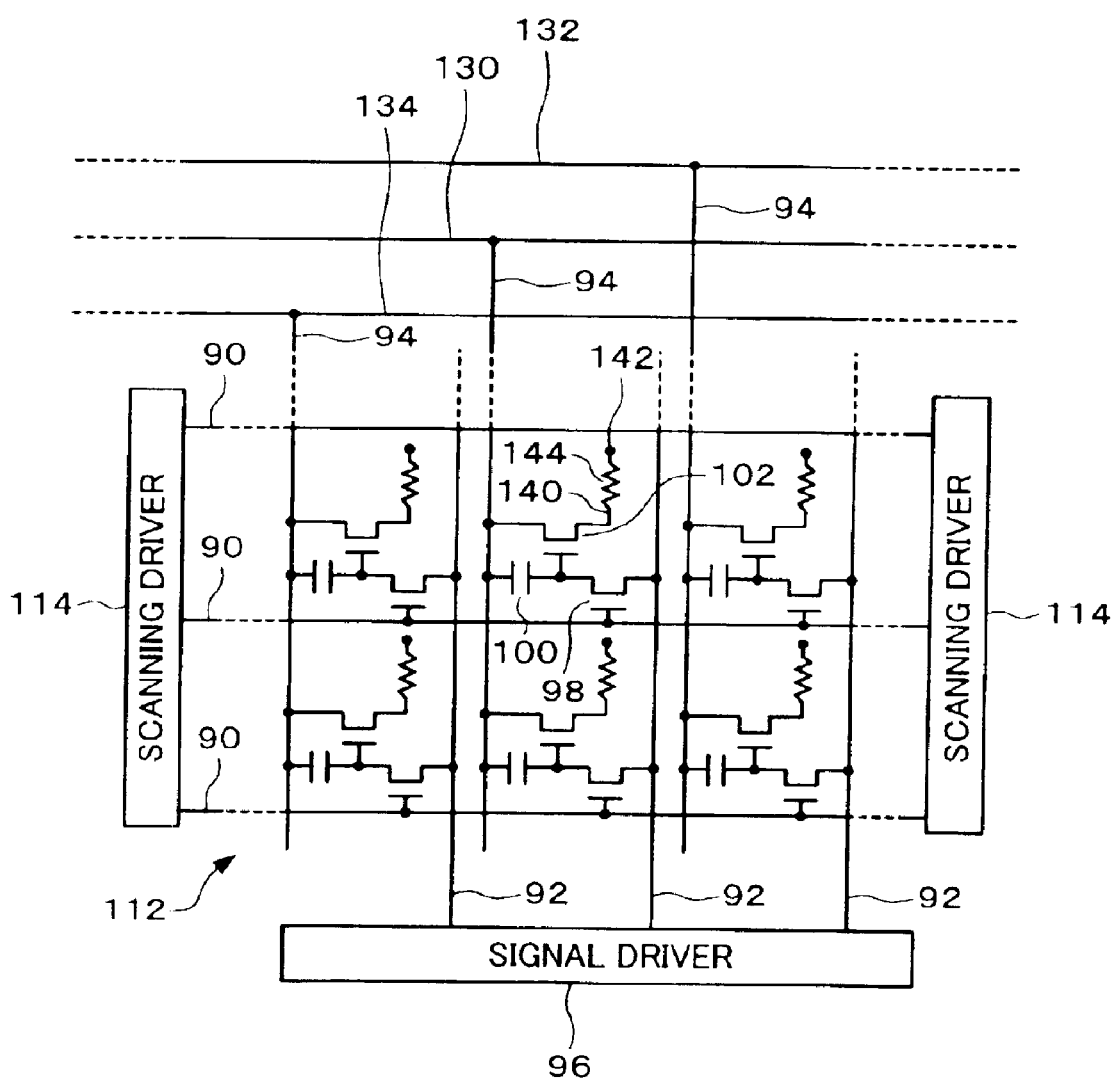
FIG. 12 is a circuit diagram of the electronic module according to the second embodiment of the present invention.

FIG. 12 is a view illustrating circuits of the electronic module according to the present embodiment. A plurality of scanning lines 90, a plurality of signal lines 92 which extend in the direction intersecting the scanning lines 90, and a plurality of power supply lines 94 which extend along the signal lines 92 are formed on an operating section 112. The power supply lines 94 are electrically connected with either of the power supply interconnects 130, 132, or 134. A luminescent material 144 which becomes a pixel is provided corresponding to each intersecting point of the scanning lines 90 and the signal lines 92. Current flows from the power supply line 94 to an anode 140 through a channel of the drive element 102, and flows to a cathode 142 through the luminescent material 144. The luminescent material 144 emits light corresponding to the amount of current that flows through the luminescent material 144. For other details, explanations of the circuits (see FIG. 5) in the first embodiment shall apply.

Third Embodiment

Figure 13:
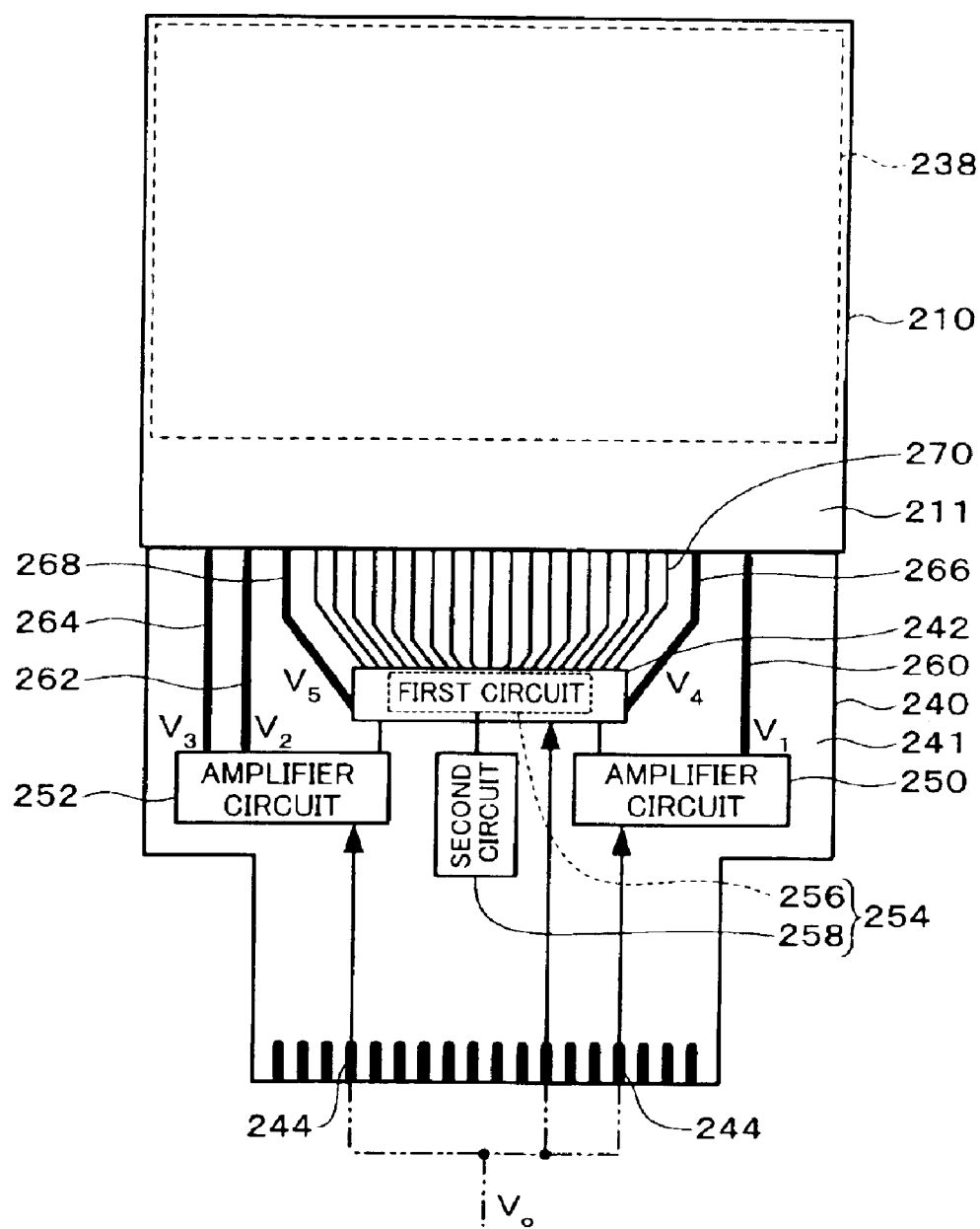
FIG. 13 illustrates an electronic module according to a third embodiment of the present invention.
Figure 14:
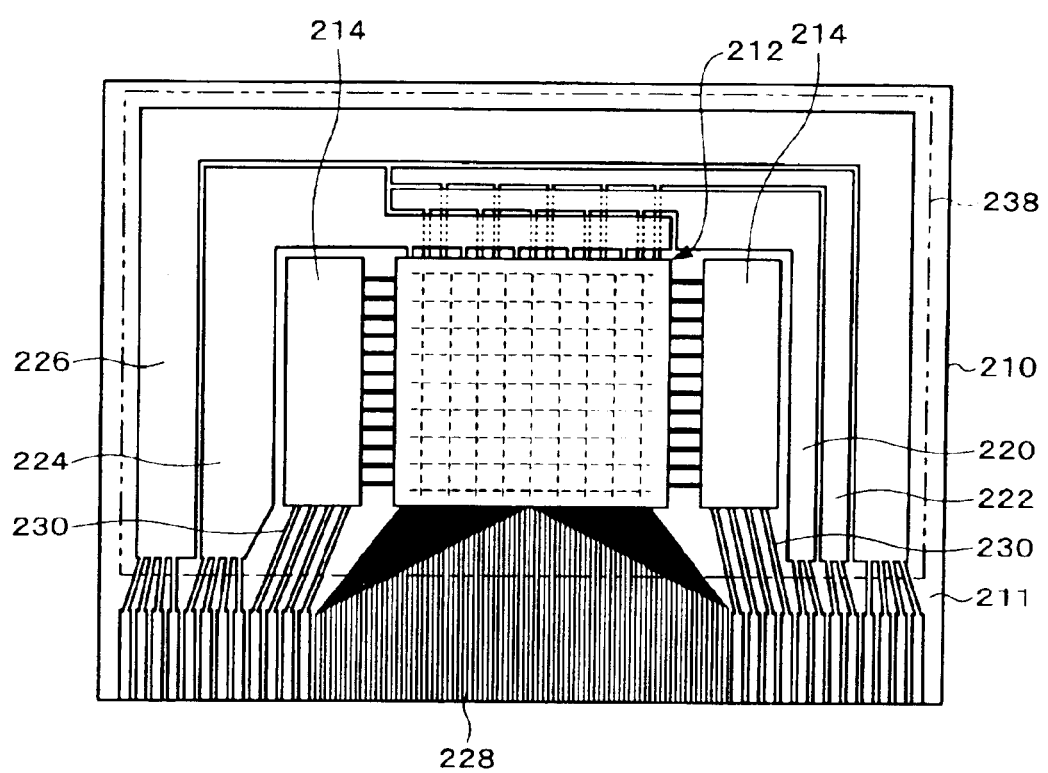
FIG. 14 is a plan view showing an electronic substrate of the electronic module according to the third embodiment of the present invention.
Figure 15:
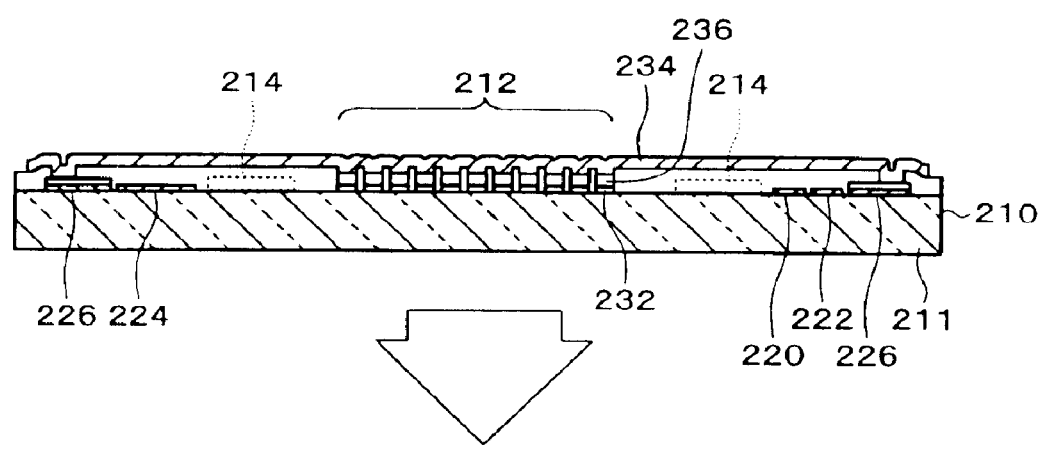
FIG. 15 is a cross-sectional view illustrating the electronic substrate of the electronic module according to the third embodiment of the present invention.

FIG. 13 illustrates an electronic module (EL module or liquid crystal module, for example) according to a third embodiment of the present invention. The electronic module has an electronic substrate 210. FIG. 14 is a plan view of the electronic substrate, and FIG. 15 is a cross-sectional view of the electronic substrate. The electronic substrate 210 may be a display panel (EL panel or liquid crystal panel, for example). The electronic substrate 210 has a substrate 211. The substrate 211 may be a glass substrate, a plastic substrate, or a silicon substrate. As shown in FIG. 15, in the case where light is extracted from the substrate 211, a light-transmitting substrate is used as the substrate 211.

The electronic substrate 210 has an operating section 212. The operating section 212 is a section in which operations for displaying an image are performed. In the present embodiment, the operating section 212 is an EL (organic EL, for example) section. The EL section emits light by utilizing an electroluminescence phenomenon. The EL section may be of a carrier injection type. The EL section may be driven by electric current. In more detail, current flows through a luminescent material (organic material, for example) 236 (see FIG. 15).

A pair of scanning drivers 214 is formed on both sides of the operating section 212, respectively, on the electronic substrate 210. The scanning driver 214 may be a chip component or a thin film circuit (circuit including TFTs) formed on the substrate 211.

The electronic substrate 210 has a plurality of anode interconnects 220, 222, and 224. Each of the anode interconnects 220, 222, and 224 is an interconnect for allowing current to flow through the operating section 212. Each of the anode interconnects 220, 222, and 224 is formed to have a different width, and is suitable for allowing a different value of current to flow corresponding to the difference in luminous efficiency due to the color (RGB) of the luminescent material 236 (see FIG. 15). The electronic substrate 210 has a cathode interconnect 226. The anode interconnects 220, 222, and 224 and the cathode interconnect 226 are formed in a pair of regions which are located on both sides of the operating section 212. The cathode interconnect 226 is disposed on the outer side of the anode interconnects 220, 222, and 224. The cathode interconnect 226 is formed in the shape of the letter "C" so as to avoid the edge on which an interconnect substrate 240 is attached.

The electronic substrate 210 has signal interconnects 228. The signal interconnects 228 supply a drive signal to the operating section 212. The electronic substrate 210 has control interconnects 230. The control interconnects 230 are formed in a pair of regions which are located on both sides of the signal interconnects 228 and interpose between first and second regions in which one part and the other part of the anode interconnects 220, 222, and 224 and the cathode interconnects 226 are formed. The signal interconnects 228 are formed in a region interposing between a pair of regions in which the control interconnects 230 are formed. The signal interconnects 228 are formed in a region interposing between the first and second regions in which one part and the other part of the anode interconnects 220, 222, and 224 and the cathode interconnects 226 are formed. The signal interconnects 228 are formed to be narrower than the control interconnects 230. The signal interconnects 228 are formed to be narrower than the anode interconnects 220, 222, and 224 and the cathode interconnect 226.

The anode interconnects 220, 222, and 224, the cathode interconnect 226, the signal interconnects 228, and the control interconnects 230 are arranged to extend toward one side of the electronic substrate 210. The end of each interconnect is a terminal.

The anode interconnects 220, 222, and 224 are connected with a plurality of anodes 232 (see FIG. 15). The cathode interconnect 226 is connected with a cathode 234 (see FIG. 15). The cathode 234 is formed to face the anodes 232. The luminescent material 236 is provided between each of the anodes 232 and the cathode 234. A hole transport layer may be formed between the anodes 232 and the luminescent material 236, and an electron transport layer may be formed between the cathode 234 and the luminescent material 236.

A sealing section 238 may be optionally provided to the electronic substrate 210. The sealing section 238 is provided to cover the cathode 234 to prevent entrance of moisture or oxygen. The sealing section 238 may be formed of a glass substrate or a plastic substrate if light transmittance is required. The sealing section 238 may be formed of a metal or silicon if light transmittance is not required.

An electronic module has an interconnect substrate 240. The interconnect substrate 240 has a substrate 241. The substrate 241 may be a flexible substrate. The interconnect substrate 240 (substrate 241) is attached to the electronic substrate 210. The electrical connection between the electronic substrate 210 and the interconnect substrate 240 may be achieved by using an anisotropic conductive material (anisotropic conductive film or anisotropic conductive paste, for example).

An integrated circuit chip 242 is mounted on the interconnect substrate 240. The signal driver 96 having a function of generating a signal supplied to the operating section 212 (see FIG. 17) may be formed in the integrated circuit chip 242. The integrated circuit chip 242 may be bonded face down or electrically connected by tape automated bonding (TAB). The integrated circuit chip 242 is mounted at the center of the interconnect substrate 240 in the widthwise direction.

The interconnect substrate 240 has input terminals 244. The input terminals 244 are ends of an interconnect pattern (not shown). The input terminals 244 are formed on the end of an interconnect substrate 240 excluding the portion where the electronic substrate 210 is attached. The input terminals 244 are formed to be wider than the power supply interconnects 260, 262, 264, 266, and 268. The input terminals 244 may be formed extending toward one side of the interconnect substrate 240.

Figure 16:
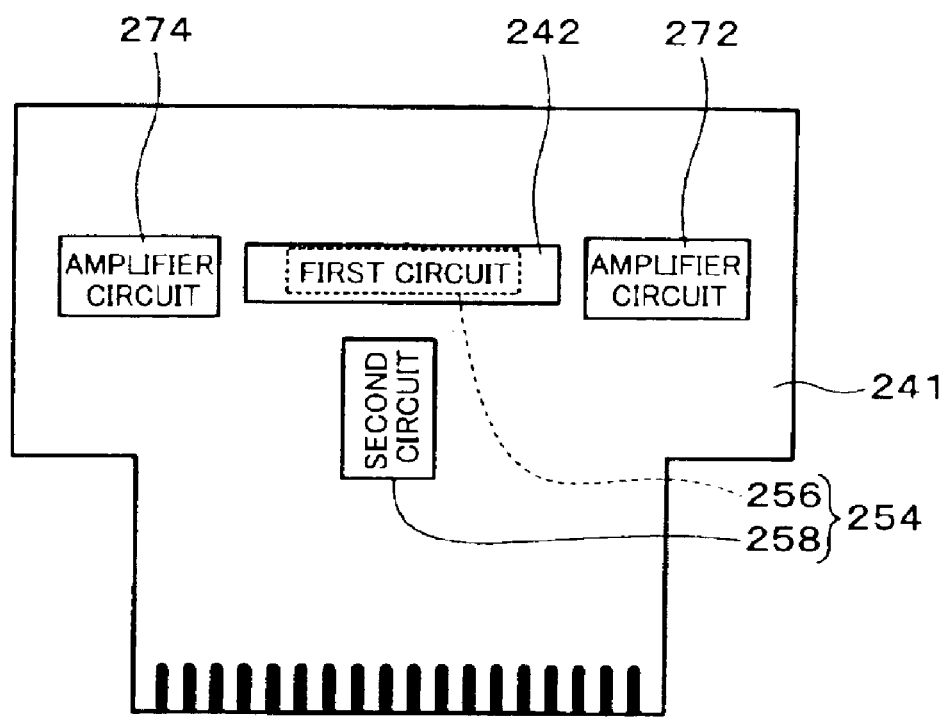
FIG. 16 illustrates a modification of interconnect substrate of the electronic module according to the third embodiment of the present invention.

An external power supply $V_0$ is input to the input terminals 244. The external power supply $V_0$ may be a single power supply (voltage). The integrated circuit chip 242 may be driven by the external power supply $V_0$. The interconnect substrate 240 has one or more of amplifier circuits 250, 252, and 254. The amplifier circuits 250, 252, and 254 amplify (increase the voltage) the external power supply $V_0$ input to the input terminals 244 to generate a plurality of different (in voltage) amplified power supplies $V_1$ to $V_5$. The amplifier circuits 250, 252, and 254 are formed in the region interposing between the integrated circuit chip 242 and the input terminals 244. A pair of the amplifier circuits 250 and 252 are formed on both end portions of the interconnect substrate 240, respectively, in the widthwise direction. In a modification example shown in FIG. 16, a pair of amplifier circuits 272 and 274 are respectively formed in a pair of regions located on both sides of the integrated circuit chip 242.

According to the present embodiment, since a plurality of different amplified power supplies $V_1$ to $V_5$ are generated by amplifying the external power supply $V_0$, the electronic module can be driven merely by inputting a few types of external power supplies (single power supply, for example) $V_0$.

The amplifier circuits 250 and 252 are separately formed from the integrated circuit chip 242. This makes it possible to prevent the integrated circuit chip 242 from being influenced by the amplification effect by the amplifier circuits 250 and 252. This configuration may be applied to the case where the amplifier circuits 250 and 252 cannot be incorporated into the integrated circuit chip 242 due to high current values of the amplified power supplies $V_1$, $V_2$, and $V_3$.

The amplifier circuit 254 is made up of a first circuit 256 and a second circuit 258. The first circuit 256 is formed in the integrated circuit chip 242. The second circuit 258 is separately formed from the integrated circuit chip 242. The second circuit 258 may include a capacitor or an inductor, and make up at least a part of a charge pump circuit. It is advantageous to separately form the second circuit 258 from the integrated circuit chip 242 in the case where the second circuit 258 requires a number of parts.

The interconnect substrate 240 includes power supply interconnects 260, 262, 264, 266, and 268. The power supply interconnects 260, 262, 264, 266, and 268 extend from the amplifier circuits 250, 252, and 254 toward the electronic substrate 210.

The amplifier circuit 250 is electrically connected with the power supply interconnect 260. The power supply interconnect 260 is electrically connected with the anode interconnect 224 of the electronic substrate 210. FIG. 13 shows the back surface of the electronic substrate 210 shown in FIG. 14. The external power supply $V_0$ input to the amplifier circuit 250 is amplified to the amplified power supply $V_1$. The amplified power supply $V_1$ is input to the anode interconnect 224 through the power supply interconnect 260. The amplifier circuit 252 is electrically connected with the power supply interconnects 262 and 264. Each of the power supply interconnects 262 and 264 is electrically connected with the anode interconnects 220 and 222 of the electronic substrate 210. The external power supply $V_0$ input to the amplifier circuit 252 is amplified to the amplified power supplies $V_2$ and $V_3$. The amplified power supplies $V_2$ and $V_3$ are input to the anode interconnects 220 and 222 through the power supply interconnects 262 and 264, respectively. The electronic substrate 210 is driven by the amplified power supplies $V_1$, $V_2$, and $V_3$.

The power supply interconnects 260, 262 and 264 are formed extending through a pair of regions located on both sides of the integrated circuit chip 242. If the power supply interconnects 260, 262, and 264 are formed extending through only one side of the pair of regions located on both sides of the integrated circuit chip 242, the power supply interconnects 260 becomes longer than the power supply interconnects 262 and 264, for example. In the present embodiment, since the difference in length between the power supply interconnects 260, 262 and 264 is small, current can be allowed to flow uniformly.

The amplifier circuit 254 is electrically connected with the power supply interconnects 266 and 268. Each of the power supply interconnects 266 and 268 is electrically connected with the control interconnects 230 of the electronic substrate 210. The control interconnects 230 connected with the power supply interconnects 266 and 268 are used to supply power to the scanning driver 214. The external power supply $V_0$ input to the amplifier circuit 254 is amplified to the amplified power supplies $V_4$ and $V_5$. The amplified power supplies $V_4$ and $V_5$ are input to the control interconnects 230 through the power supply interconnects 266 and 268, respectively.

The interconnect substrate 240 has signal interconnects 270 extending from the integrated circuit chip 242 to the electronic substrate 210. The signal interconnects 270 are formed in a region interposing between first and second regions in which one part and the other part of the power supply interconnects 260, 262, 264, 266, and 268 are formed. The signal interconnects 270 are electrically connected with the signal interconnect 228 of the electronic substrate 210. The power supply interconnects 260, 262, 264, 266, and 268 may be formed to be wider than the signal interconnects 270.

The interconnect substrate 240 has a control interconnects (interconnect for supplying a signal such as a clock signal from the integrated circuit chip 242 to the scanning driver 214), a cathode interconnect (interconnect electrically connected with the cathode interconnects 226), an input interconnect (interconnect connected with the input terminal 244), and the like (not shown).

In a method of driving the electronic module according to the present embodiment, the external power supply $V_0$ is input to the input terminals 244 formed on the interconnect substrate 240 on which the integrated circuit chip 242 is mounted. A plurality of amplified power supplies $V_1$ to $V_5$ are generated by amplifying the external power supply $V_0$ by using one or more of the amplifier circuits 250, 252, and 254 formed on the interconnect substrate 240. The electronic substrate 210 electrically connected with the interconnect substrate 240 is driven by the amplified power supplies $V_1$ to $V_5$.

Figure 17:
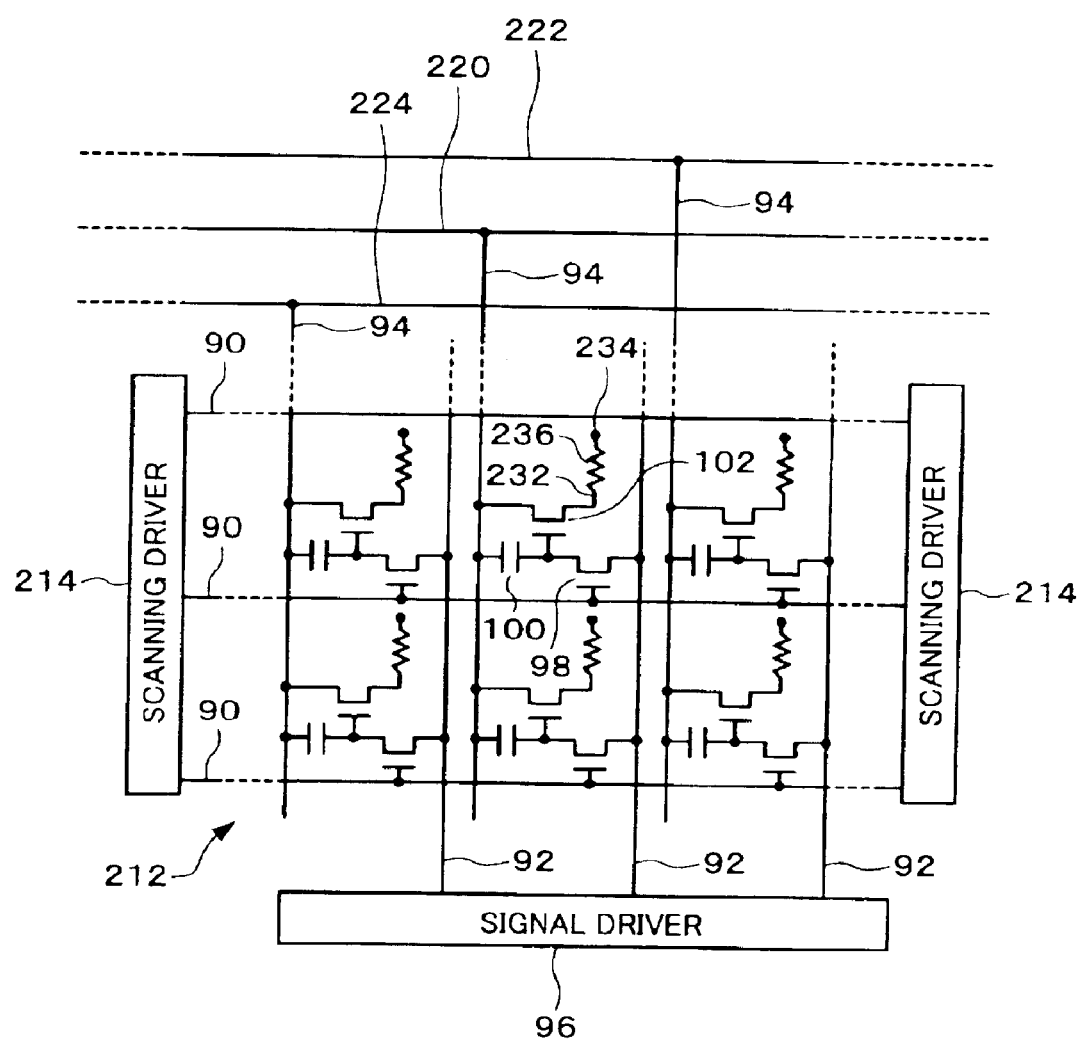
FIG. 17 is a circuit diagram of the electronic module according to the third embodiment of the present invention.

FIG. 17 is a circuit diagram illustrating circuits of the electronic module according to the present embodiment. A plurality of scanning lines 90, a plurality of signal lines 92 which extend in the direction intersecting the scanning lines 90, and a plurality of power supply lines 94 which extend along the signal lines 92 are formed in the operating section 212. The power supply lines 94 are electrically connected with one of the anode interconnects 220, 222, and 224. A luminescent material 236 which becomes a pixel is provided corresponding to each intersecting point of the scanning lines 90 and the signal lines 92. Current flows from the power supply line 94 to an anode 232 through a channel of the drive element 102, and flows to a cathode 234 through the luminescent material 236. The luminescent material 236 emits light corresponding to the amount of current that flows through the luminescent material 236. For other details, explanations of the circuits (see FIG. 5) in the first embodiment shall apply.

Figure 18:
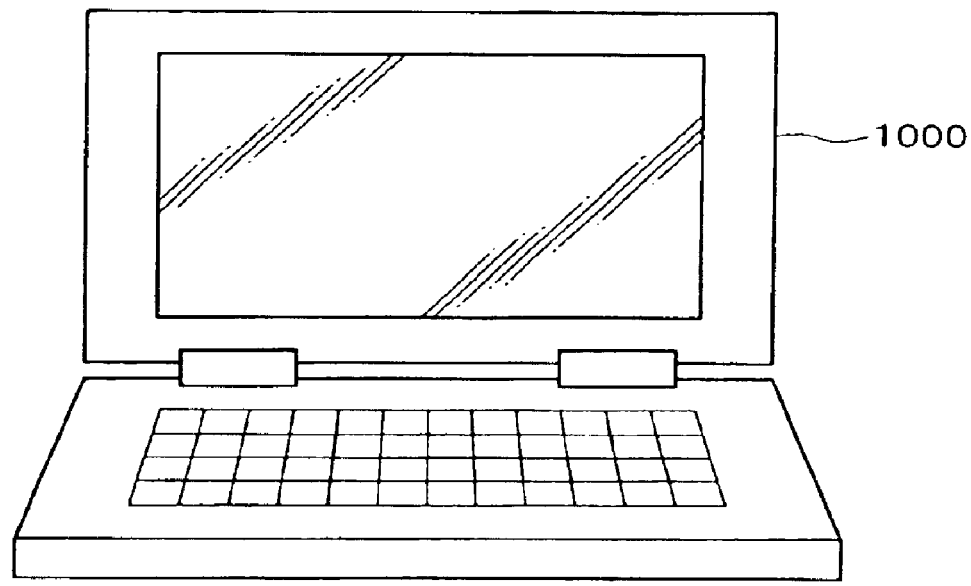
FIG. 18 illustrates an example of an electronic instrument according to an embodiment of the present invention.
Figure 19:
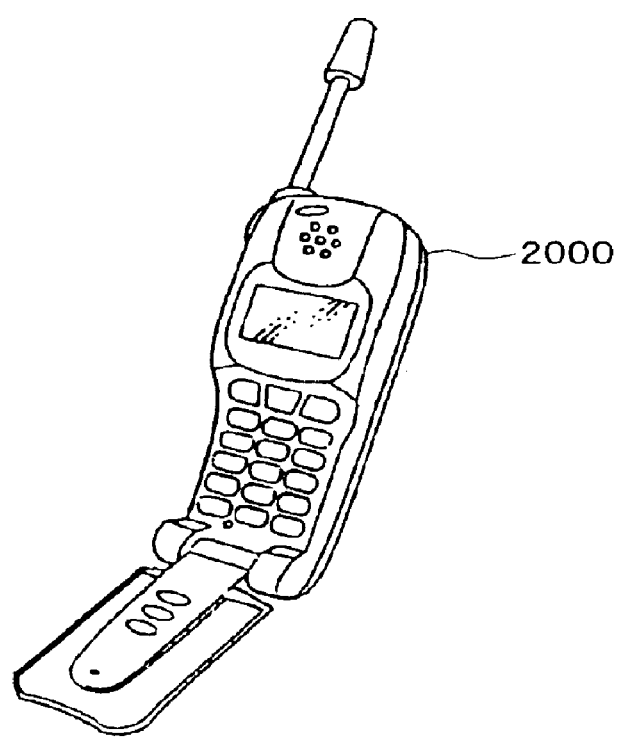
FIG. 19 illustrates another example of an electronic instrument according to an embodiment of the present invention.

As an electronic instrument including the electronic module (EL module or liquid crystal module, for example) according to the embodiment of the present invention, FIG. 18 illustrates a notebook-type personal computer 1000, and FIG. 19 illustrates a portable telephone 2000.

The present invention is not limited to the above-described embodiments. Various modifications and variations are possible. For example, the present invention includes configurations essentially the same as the configurations described in the embodiments (for example, configurations having the same function, method, and results, or configurations having the same object and results). The present invention includes configurations in which any unessential part of the configuration described in the embodiments is replaced. The present invention includes configurations having the same effects or achieving the same object as the configurations described in the embodiments. The present invention includes configurations in which conventional technology is added to the configurations described in the embodiments.

What is claimed is:

1. An electronic module comprising:
   an electroluminescent section;
   a first substrate on which the electroluminescent section is formed;
   a second substrate attached to the first substrate;
   an integrated circuit chip mounted on the second substrate; and
   a plurality of power supply interconnects for allowing current to flow through the electroluminescent section,
   the power supply interconnects including: a plurality of first power supply interconnects formed on the first substrate, extending through a pair of regions located on both sides of the electroluminescent section; and a plurality of second power supply interconnects formed on the second substrate, extending through a pair of regions located on both sides of the integrated circuit chip, the first and second power supply interconnects being electrically connected.

2. The electronic module as defined by claim 1, further comprising:
   a plurality of signal interconnects for inputting a drive signal from the integrated circuit chip to the electroluminescent section,
   the signal interconnects being formed in a region interposed between a first region in which one part of the power supply interconnects are formed and a second region in which the other part of the power supply interconnects are formed.

3. The electronic module as defined by claim 2, a width of each of the signal interconnects being narrower than a width of each of the power supply interconnects.

4. The electronic module as defined by claim 2, further comprising:
   a pair of scanning drivers disposed on both sides of the electroluminescent section, respectively, on the first substrate; and
   a plurality of control interconnects for inputting a control signal from the integrated circuit chip to each of the scanning drivers,
   the control interconnects being formed in a pair of regions which are located on both sides of a region in which the signal interconnects are formed and interposed between the first region and the second region.

5. The electronic module as defined by claim 1, further comprising:
   a plurality of connector terminals formed on an end portion of the second substrate except a portion to which the first substrate is attached,
   a width of each of the connector terminals being formed to be wider than a width of each of the power supply interconnects.

6. An electronic instrument comprising the electronic module as defined by claim 1.

7. A method of manufacturing an electronic module comprising:

fixing a first substrate, on which an electroluminescent section is formed, with a second substrate on which an integrated circuit chip is mounted, the first substrate including a plurality of first power supply interconnects which are formed extending through a pair of regions located on both sides of the electroluminescent section, the second substrate including a plurality of second power supply interconnects which are formed extending through a pair of regions located on both sides of the integrated circuit chip, and the first and second power supply interconnects being electrically connected in the step of fixing the first and second substrate.

8. An electronic module comprising:

an electronic substrate including a plurality of first terminals;

an interconnect substrate on which an interconnect pattern is formed, the interconnect pattern including a plurality of second terminals electrically connected with the first terminals of the electronic substrate, at least two first interconnects extending from at least two of the second terminals, and at least two second interconnects formed in a state to be electrically insulated from the first interconnects; and an electrical connection section which electrically connects at least one of the first interconnects with at least one of the second interconnects.

9. The electronic module as defined by claim 8, further comprising:

an integrated circuit chip mounted on the interconnect substrate, the second interconnects being electrically connected with the integrated circuit chip.

10. The electronic module as defined by claim 9, the electrical connection section being provided at a position closer to the electronic substrate than the integrated circuit chip.

11. The electronic module as defined by claim 9, the electrical connection section being provided in each of a pair of regions respectively located closer to both ends of the interconnect substrate than a center of the interconnect substrate in a widthwise direction.

12. An electronic instrument comprising the electronic module as defined by claim 8.

13. A method of manufacturing an electronic module comprising:

electrically connecting a plurality of first terminals of an electronic substrate with a plurality of second terminals of an interconnect substrate; and electrically connecting at least one of two or more first interconnects extending from two or more of the second terminals with at least one of two or more second interconnects formed in a state to be electrically insulated from the first interconnects, by means of an electrical connection section.

* * * * *